(12) United States Patent
Vogman

(10) Patent No.: US 8,370,674 B2
(45) Date of Patent: Feb. 5, 2013

(54) METHOD AND APPARATUS FOR REDUCING SERVER POWER SUPPLY SIZE AND COST

(75) Inventor: Viktor D. Vogman, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 368 days.

(21) Appl. No.: 12/567,566

(22) Filed: Sep. 25, 2009

(65) Prior Publication Data

US 2011/0078479 A1    Mar. 31, 2011

(51) Int. Cl.
*G06F 1/26* (2006.01)
(52) U.S. Cl. .................. 713/340; 323/907; 713/310
(58) Field of Classification Search .......... 713/340, 713/310; 323/907
See application file for complete search history.

(56) References Cited

U.S. PATENT DOCUMENTS

| | | | |
|---|---|---|---|
| 7,062,665 B2 * | 6/2006 | Zhang et al. ................. | 713/322 |
| 7,228,448 B2 * | 6/2007 | Anderson et al. ............ | 713/340 |
| 7,466,038 B2 * | 12/2008 | Gaudreau et al. ............ | 307/82 |
| 7,646,112 B2 * | 1/2010 | Devine ........................ | 307/53 |

OTHER PUBLICATIONS

Analog Devices, ADT7461 Datasheet, Rev. B, 2005.*
SBS Implementers Forum, System Management Bus (SMBus) Specification, Version 2.0, Aug. 3, 2000.*

* cited by examiner

*Primary Examiner* — Albert Wang
(74) *Attorney, Agent, or Firm* — International IP Law Group, P.L.L.C.

(57) ABSTRACT

Computing and server power supplies are typically sized larger to deliver the maximum power the system may need. However since systems are not often used to capacity a smaller power supply may be used in conjunction with a thermal sensor to monitor a critical component of the power supply defined as the particular component within the power supply whose temperature reaches its maximum allowed limit sooner than any other power supply component when the average (continuous) power may exceed the power supply's max rating. When a critical temperature has been reached, an interrupt signal is generated by the power supply to signal the host to throttle back until the temperature comes back into an acceptable range.

16 Claims, 2 Drawing Sheets

METHOD AND APPARATUS FOR REDUCING SERVER POWER SUPPLY SIZE AND COST

FIELD OF THE INVENTION

Embodiments of the present invention are directed to power supplies for servers and the like and, more particularly, to reducing the size of power supplies without overly affecting performance.

BACKGROUND INFORMATION

In existing server systems, the power supply (PS) is sized for full system configuration running power virus software. This results in larger power supply size/wattage rating and higher system cost. In high density systems it significantly limits the available board space and system configurations. At the same time, in real applications system utilization remains at about 20-25% level, and the power supply is loaded to a small portion of its power rating. For redundant power supply configurations, where at least two power supplies share common load, average (typical) PS load additionally drops by a factor of two.

A power specification for a computer system, $P_{MAX}$, usually defines maximum power capability of the power supply in the system. In the process of determining a value of $P_{MAX}$, system designers usually consider the worst-case configuration of a system. Thus, $P_{MAX}$ for a system represents power consumption when the system is fully populated with hardware. The determination of $P_{MAX}$ also assumes that the system is configured with the most power hungry components capable of being used in that configuration, and that the system is running software that causes it to consume maximum power.

The present methods for determining $P_{MAX}$ suffer from various disadvantages. First, most systems are populated with less hardware components than their capacity. Second, in the vast majority of cases not all the components used are the most power hungry. For example, many systems may be using slower processors that usually consume less power, and the CPU utilization is infrequently being used to 100% capacity. On average, most of the systems consume power far lower than $P_{MAX}$, and hence could function adequately with a smaller power supply.

FIG. 1 comprises a histogram of real system CPU utilization in a datacenter over extended period of time (1 week) and clearly illustrates this point. Because of the low utilization rate and recent trend in idle power reduction, system power supplies are oversized, operate at low power levels and therefore have comparatively low efficiency and low power factor. This opens the opportunity for significant power supply size and cost reduction, without affecting system performance, and for improvement system performance-per-watt score.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Figure 1:
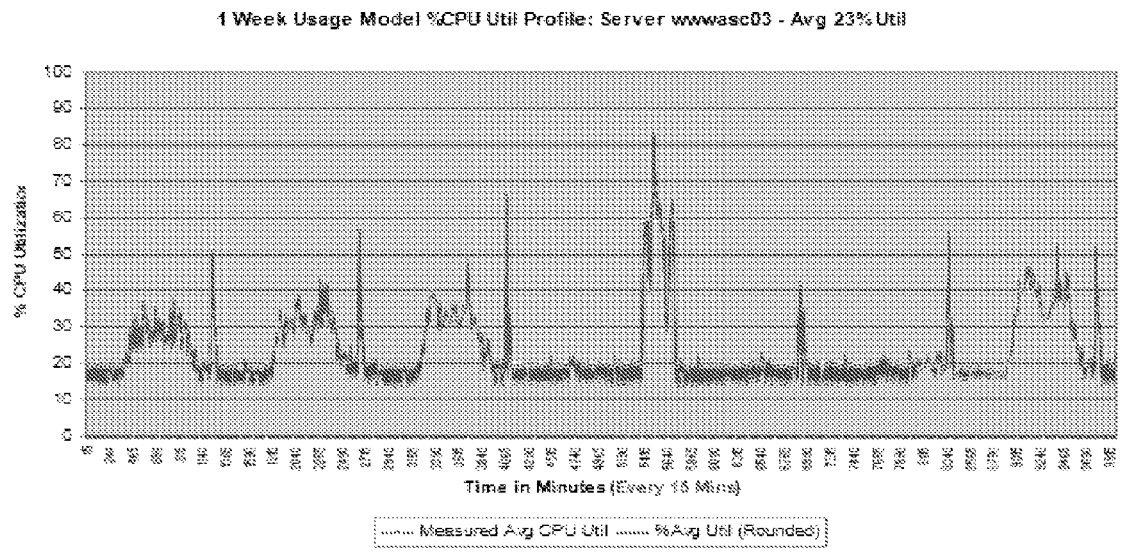
FIG. 1 is a histogram of typical central processing unit (CPU) utilization over a period of 1 week illustrating that the CPU may rarely be used to capacity for extended periods.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the present invention describe a new concept of server power supply design approach and system power management. The approach is based on developing a power supply with continuous power rating much lower (e.g. 50+% lower) than the peak by using a smaller power supply but monitoring the temperature of the power supply, which will tend to heat up during relatively infrequent prolonged periods of peak use, and throttling back the system if the power supply approaches a critical temperature to prevent damage, but still allow the CPU to complete its tasks, albeit in a throttled back capacity.

In particular embodiments the invention may use a thermal sensor to monitor a critical component of the power supply defined as the particular component within the power supply which temperature reaches its maximum allowed limit sooner than any other power supply component when generated average (continuous) power exceeds its max rating. This component may be any component in the power supply, such as, for example, an inductor, a winding, a bridge, a particular circuit, etc. and of course may vary from power supply to power supply depending on the particular architecture of the power supply.

Embodiments further may generate an interrupt signal when this component reaches critical temperature to throttle back the system to decrease the load on the power supply prior to overheating. In one embodiment the System Management Bus Alert Signal (SMBAlert#) may be used for this purpose. In brief, the System Management Bus (SMBus) is an external bus interface that may interface with the I/O controller using the SMBus. As defined by the SMBus specification, SMBAlert# is an input-only signal to the I/O controller. In particular, SMBAlert# is a signal that is an interrupt line for devices that trade their ability to master for a pin. SMBAlert# is a wired-AND signal and used in conjunction with the SMBus general call address. Messages invoked with the SMBus may be two bytes long.

A slave-only device, such as an external system management controller, or in this case the power supply, can signal the host through SMBAlert# that it wants to talk. The host processes the interrupt and simultaneously accesses all SMBAlert# devices through the alert response address. In this case, the SMBAlert# is generated in response to a power supply reaching its maximum temperature or first critical threshold causing the host to throttle back. Throttling may include many things. For example, in response to the temperature condition, the operating system may slow down operation of the processor clock, known as clock throttling.

Alternately or in addition to, non-essential components may also be slowed or shut down in an orderly fashion. Basically, throttling may be any action taken to reduce power consumption, and thus reduce the load on the power supply, until such time as the temperature of the critical component in the power supply cools and drops below a second predetermined threshold.

Figure 2:
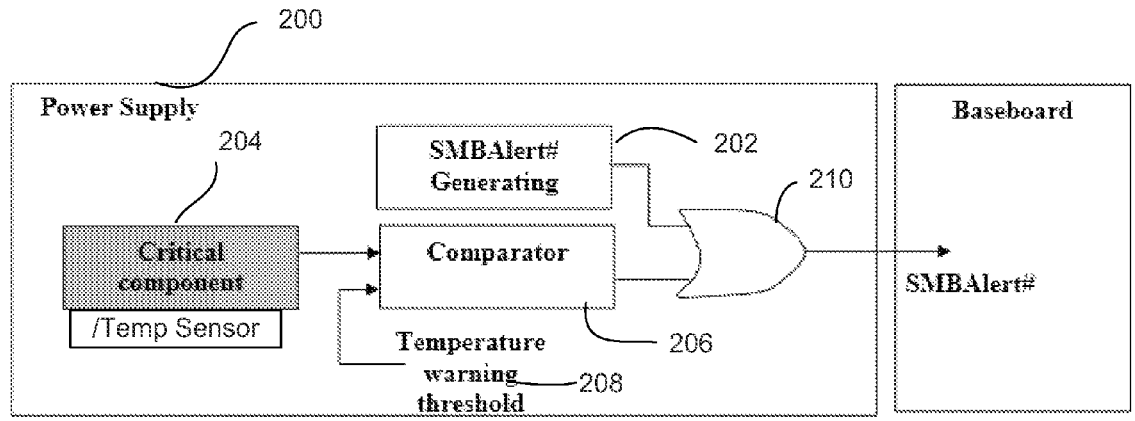
FIG. 2 is a block diagram showing a power supply modified according to one embodiment of the invention.

FIG. 2 shows a block diagram of a power supply 200 modified to generate an interrupt signal, such as a SMBAlert#, in response to a temperature condition. The block-diagram represents analog/digital way of implementing the concept, but the functions of the elements in this diagram may also be provided with a microcontroller.

The power supply 200 includes the SMBAlert# generating circuit 202, a thermal sensor 204 monitoring the temperature of the power supply critical component, as previously defined as the component which temperature reaches its max allowed limit sooner than any other power supply component, when generated average (continuous) power exceeds its max rating. The thermal sensor 204 may be a thermistor or a micro electromechanical system (MEMS) sensor, or any other suitable device.

The power supply 200 may also include a comparator 206 receiving the signal from the thermal sensor 204 and from a reference threshold voltage 208. The power supply 200 may also include an OR-gate 210, whose inputs are coupled to the SMBAlert# signal generating circuit output which may assert this signal for other warning and failure conditions besides overheating such as overcurrent conditions, overpower, AC input out of range, etc., as well as to the output signal from the comparator 206. The OR-gate output is coupled to the baseboard 212 SMBAlert# terminal for the host.

Figure 3:
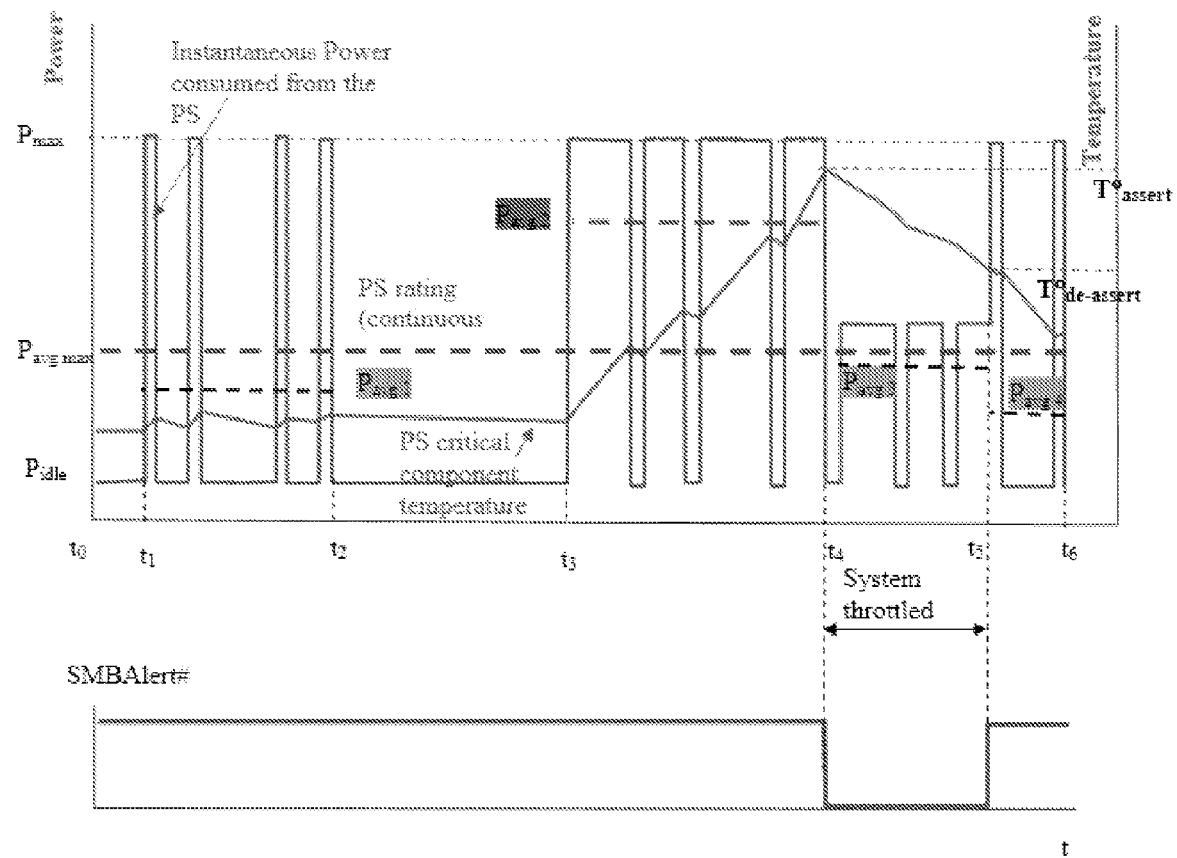
FIG. 3 is a timing diagram illustrating one example of operation of the invention.

Referring now to FIG. 3, there is shown a timing diagram illustrating exemplary operation details of one embodiment of the invention.

At time t0-t1, if system operates in its idle state and the power consumed from the power supply is low (P=Pidle) then the temperature of the critical component remains below its max limit.

At time interval t1-t2, at low utilization rate, the temperature fluctuates at the levels slightly above the idle. That is, it ramps up when system operates in active state and ramps down when it switches into the idle state, but never comes close to reaching critical temperature.

At time interval t2-t3, once system returns to idle for extended period of time, the temperature of the critical component asymptotically approaches its idle level.

At time t3, when the server may be experiencing high utilization and average power (Pavg2) exceeds the power supply rating Pavg max, the temperature of the critical component starts to ramp up and at some moment of time (t4) reaches level Tassert. At this moment the comparator (206, FIG. 2) trips and causes the SMBAlert# signal to be asserted.

During time interval t4-t5, upon receiving the SMBAlert# signal, the system gets throttled down, and continues to handle all job requests, but driving memory/processor power reduction, so that its average power (Pavg3) drops below the power supply rating. During this time period the critical component temperature ramps down.

During time interval t5-t6, once the temperature of the critical component eventually drops to the Tde-assert level, the SMBAlert# gets deasserted and system either operates at a low utilization rate, or—if there is still a demand for high utilization, the process of ramping the component temperature up and assertion of the SMBAlert# will be repeated.

Thus, according to embodiments the system will operate at its max performance, even using a smaller power supply until the power supply temperature limit is reached, after that the system will be operated in a safe mode allowing it to complete the job (if it takes longer than the time interval required to reach Tassert) without a shutdown. This invention opens the opportunity for significant server system power supply size and cost reduction without overly affecting system performance. Further, a smaller power supply frees space, adding components to the baseboard and for improvement system performance-per-watt score.

In other embodiments, when multi-output power supplies are used, they may incorporate several temperature sensors monitoring temperatures of the critical components in each channel and asserting the SMBAlert# when any of these temperatures exceeds corresponding $T_{assert}$ level. In other embodiments, at low ambient temperatures, or in a redundant (1+1, 2+1, 2+2, etc) power supply configuration where several power supplies share common load, the power supplies may be capable of supplying full power without reaching the Tassert level. In these cases system throttling may occur when the ambient temperature gets higher, or when one of the Power supplies (or AC sources) fails. This gives the opportunity to achieve the most effective power supply utilization regardless of ambient temperature level, drastically (and in some cases ~2x) lower power supply power rating and cost, to reduce power subsystem dimensions, expand the baseboard, and get the space for additional system components.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A power supply, comprising:
    a plurality of components for delivering power, wherein the power supply provides the power to a host system and has a lower rating than that required by the host system during peak utilization times;
    a critical component among the plurality of components;
    a thermal sensor to monitor a temperature of the critical component; and
    a circuit for generating an interrupt signal if the thermal sensor senses that the critical component has reached a first threshold temperature.

2. The power supply as recited in claim 1, wherein the interrupt signal causes the host system to throttle.

3. The power supply as recited in claim 1 wherein the interrupt signal comprises a SMBAlert# signal.

4. The power supply as recited in claim 1 wherein the circuit for generating the interrupt signal comprises a comparator for comparing an output of the thermal sensor to a reference signal.

5. The power supply as recited in claim 1 wherein the circuit for generating the interrupt signal is a microprocessor and the interrupt signal is determined by software.

6. A method, comprising:
    sizing a power rating of a power supply smaller than a power rating of a computing device receiving power;

identifying a component within the power supply that reaches its maximum temperature during heavy load times before other components;

monitoring a temperature of the identified component; and generating a signal to cause the computing device receiving power from the power supply to throttle when the identified component reaches an upper threshold temperature.

7. The method as recited in claim 6 wherein the interrupt signal comprises a SMBAlert# signal.

8. The method as recited in claim 6 wherein the throttling comprises:

causing the computing device to operate at a slower clock rate.

9. The method as recited in claim 6 further comprising:

deasserting the interrupt signal when the temperature of the identified component drops to a lower threshold temperature.

10. The method as recited in claim 6 wherein the power supply comprises a comparator for comparing the temperature of the identified component to a temperature warning threshold signal.

11. The method as recited in claim 6 wherein the generating is done with software.

12. A system for using a smaller power supply than a power supply called for by a computer, comprising:

a power supply for the computer, wherein the power supply has a power rating lower than that called for by the computer;

a temperature sensor within the power supply;

a component within the power supply that reaches its maximum allowable temperature before other components which are monitored by the temperature sensor; and means for generating an interrupt signal to cause the computer to throttle when the temperature sensor detects a threshold temperature has been reached.

13. The system as recited in claim 12 wherein the interrupt signal comprises as SMBAlert# signal.

14. The system as recited in claim 13 wherein throttling comprises running the computer at a slower clock speed.

15. The system as recited in claim 13 wherein the computer comprises a server.

16. The system as recited in claim 13, comprising a plurality of power supplies for the computer, comprising:

a corresponding plurality of critical components;

a corresponding plurality of temperature sensors; and a corresponding plurality of means for generating the interrupt signal to cause the computer to throttle when the temperature sensors detect the threshold temperature has been reached.

\* \* \* \* \*